(12) United States Patent
Lee et al.

(10) Patent No.: US 8,502,211 B2
(45) Date of Patent: Aug. 6, 2013

(54) ORGANIC LIGHT EMITTING DIODE DISPLAY AND MANUFACTURING METHOD THEREOF

(75) Inventors: Dae-Woo Lee, Yongin (KR); Han-Hee Yoon, Yongin (KR); Kyoung-Bo Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 168 days.

(21) Appl. No.: 13/172,753

(22) Filed: Jun. 29, 2011

(65) Prior Publication Data
US 2012/0001185 A1    Jan. 5, 2012

(30) Foreign Application Priority Data
Jun. 30, 2010 (KR) .......................... 10-2010-0062879
Jun. 29, 2011 (KR) .......................... 10-2011-0063562

(51) Int. Cl.
*H01L 33/00* (2010.01)

(52) U.S. Cl.
USPC ............... 257/40; 257/E51.018; 257/E51.019

(58) Field of Classification Search
USPC .............................. 257/40, E51.018, E51.019
See application file for complete search history.

(56) References Cited

U.S. PATENT DOCUMENTS

| | | | |
|---|---|---|---|
| 2008/0116463 A1* | 5/2008 | Ito | 257/72 |
| 2009/0137074 A1* | 5/2009 | Lee et al. | 438/29 |
| 2010/0025664 A1* | 2/2010 | Park | 257/40 |
| 2010/0052534 A1* | 3/2010 | Lee | 315/51 |

FOREIGN PATENT DOCUMENTS

| | | |
|---|---|---|
| JP | 2005-242370 | 9/2005 |
| JP | 2006-128077 | 5/2006 |
| KR | 10-2005-0045768 A | 5/2005 |
| KR | 10-2005-0113413 A | 12/2005 |
| KR | 10-2006-0001746 A | 1/2006 |

* cited by examiner

*Primary Examiner* — Victor A Mandala
(74) *Attorney, Agent, or Firm* — Christie, Parker & Hale, LLP

(57) ABSTRACT

An organic light emitting diode display includes: a substrate having first and second regions; a first thin film transistor (TFT) including source and drain electrodes at the first region; a second TFT including source and drain electrodes at the second region; a protective layer on the first and second TFTs; a planarization layer pattern on the protective layer; a first pixel electrode electrically connected to the source electrode or the drain electrode of the first TFT through a first via contact hole through the protective layer; and a second pixel electrode electrically connected to the source electrode or the drain electrode of the second TFT through a second via contact hole formed through the protective layer and the planarization layer pattern, the planarization layer pattern corresponding to a shape of the second pixel electrode and located between the protective layer and the second pixel electrode.

16 Claims, 9 Drawing Sheets

ORGANIC LIGHT EMITTING DIODE DISPLAY AND MANUFACTURING METHOD THEREOF

CROSS-REFERENCE TO RELATED APPLICATIONS

This application claims priority to and the benefit of Korean Patent Application No. 10-2010-0062879 filed on Jun. 30, 2010, and Korean Patent Application No. 10-2011-0063562 filed on Jun. 29, 2011, in the Korean Intellectual Property Office, the entire disclosures of which are incorporated herein by reference.

BACKGROUND

1. Field

The described technology relates generally to an organic light emitting diode display and a manufacturing method thereof.

2. Description of the Related Art

In general, an organic light emitting diode (OLEO) is a self light emitting diode that electrically excites an organic compound to emit light. Organic light emitting diode displays are classified into passive matrix and active matrix displays, depending on a driving method of N×M pixels that are arranged in a matrix. Because the active matrix organic light emitting diode (AMOLED) display has lower power consumption than a passive matrix (PMOLED) display, AMOLED displays are suited for large and high resolution displays.

Organic light emitting diodes may be classified into a top emission type or bottom emission type organic light emitting diode, which are named according to the emission direction of light that is emitted from the organic compound. A dual type organic light emitting diode includes both the top emission type and the bottom emission type organic light emitting diodes. The top emission type organic light emitting diode is a device that emits light in an opposite direction of (e.g., away from) the substrate on which unit pixels are disposed and the bottom emission type organic light emitting diode is a device that emits light toward (e.g., through) the substrate. The top emission type organic light emitting diodes have a larger aperture ratio than the bottom emission type organic light emitting diodes.

In accordance with the down sizing and the low power consumption of the organic light emitting diode, there is a demand for a dual type organic light emitting diode display that is provided with the main display window that is the top emission type organic light emitting diode and the auxiliary display window that is the bottom emission type organic light emitting diode (e.g., the auxiliary display window being on an opposite side from the main display window). The organic light emitting diode display may be used in a portable phone, and, in one embodiment, the auxiliary display window is provided at an outside portion of the phone while the main display window is provided at an inside portion. Particularly, the auxiliary display window has low power consumption as compared to the main display window, and, in some embodiments, when the portable phone is in a call waiting (e.g., standby) state, the auxiliary display is maintained in an on state so that information such as a battery remaining amount and time may be displayed.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the present invention are directed to a dual type organic light emitting diode display that reduces or suppresses an increase of resistance of pixel electrode of a bottom emission type organic light emitting diode and a method for manufacturing the same.

According to one embodiment of the present invention, an organic light emitting diode display includes: a substrate having a first region and a second region; a first thin film transistor including a source electrode and a drain electrode at the first region; a second thin film transistor including a source electrode and a drain electrode at the second region; a protective layer on the first and second thin film transistors; a first planarization layer on the protective layer; a second planarization layer pattern on the first planarization layer; a first pixel electrode electrically connected to the source electrode or the drain electrode of the first thin film transistor through a first via contact hole formed through the protective layer and the first planarization layer; and a second pixel electrode electrically connected to the source electrode or the drain electrode of the second thin film transistor through a second via contact hole formed through the protective layer, the first planarization layer, and the second planarization layer, the second planarization layer corresponding to a shape of the second pixel electrode and being located between the first planarization layer and the second pixel electrode.

The protective layer may include a silicon nitride film, a silicon oxide film, or a layered structure thereof.

The first planarization layer and the second planarization layer pattern may include a material that is selected from the group consisting of polyimide, benzocyclobutene series resin, spin on glass (SOG), acrylate, and combinations thereof.

The second pixel electrode may include a reflective film pattern and a transparent electrode pattern.

The transparent electrode pattern may have a thickness in the range of 10 to 300 Å.

The first pixel electrode may include a transparent electrode pattern.

The first region may include a bottom emission or dual emission organic light emitting diode, and the second region may include a top emission organic light emitting diode.

The second planarization layer pattern and the first pixel electrode may be formed on the first planarization layer.

According to another embodiment of the present invention, an organic light emitting diode display includes: a substrate including a first region and a second region; a first thin film transistor including a source electrode and a drain electrode at the first region of the substrate; a second thin film transistor having a source electrode and a drain electrode at the second region of the substrate; a protective layer on the first and second thin film transistors; a planarization layer pattern on the protective layer; a first pixel electrode electrically connected to the source electrode or the drain electrode of the first thin film transistor through a first via contact hole formed through the protective layer; and a second pixel electrode electrically connected to the source electrode or the drain electrode of the second thin film transistor through a second via contact hole formed through the protective layer and the planarization layer pattern, the planarization layer pattern corresponding to a shape of the second pixel electrode and being located between the protective layer and the second pixel electrode.

The protective layer may include a silicon nitride film, a silicon oxide film or a layered structure thereof.

The planarization layer pattern may include a material selected from the group consisting of polyimide, benzocyclobutene series resin, spin on glass (SOG), acrylate, and combinations thereof.

The first region may include a bottom emission or dual emission organic light emitting diode, and the second region may include a top emission organic light emitting diode.

The second pixel electrode may include a reflective film pattern and a transparent electrode pattern.

The transparent electrode pattern may have a thickness in the range of 10 to 300 Å.

The first pixel electrode may include a transparent electrode pattern.

The planarization layer pattern and the first pixel electrode may be on the protective layer.

According to one embodiment of the present invention, a method for manufacturing an organic light emitting diode display includes: forming a first thin film transistor including a source electrode and a drain electrode at a first region of a substrate; forming a second thin film transistor including a source electrode and a drain electrode at a second region of the substrate; forming a protective layer and a first planarization layer on the first and second thin film transistors; forming a first via contact hole that exposes the source electrode or the drain electrode of the first thin film transistor by etching a portion of the protective layer and a portion of the first planarization layer; forming a first pixel electrode material layer on at least a portion of the surface of the substrate including the first via contact hole; etching the first pixel electrode material layer to form a first pixel electrode at the first region; forming a second planarization layer on at least a portion of the surface of the substrate including the first pixel electrode; forming a second via contact hole that exposes the source electrode or the drain electrode of the second thin film transistor by etching portions of the protective layer, the first planarization layer, and the second planarization layer at the second region; forming a second pixel electrode material layer on at least a portion of the surface of the substrate including the second via contact hole; and etching the second pixel electrode material layer to form a second pixel electrode at the second region.

The forming the second pixel electrode material layer may include: forming a reflective film material layer and a transparent electrode material layer on at least a portion of the surface of the substrate including the second via contact hole; forming a photoresist film on the portion of the surface of the substrate that includes the reflective film material layer and the transparent electrode material layer; forming a photoresist pattern by patterning the photoresist film; and forming the second pixel electrode at the second region by etching the reflective film material layer and the transparent electrode material layer by using the photoresist pattern as a mask.

The method may further include, after the etching the second pixel electrode material layer to form the second pixel electrode, etching the second planarization layer to form a second planarization layer pattern that corresponds to a shape of the second pixel electrode by using the second pixel electrode as a mask.

The etching the second planarization layer may expose an upper surface of the first pixel electrode at the first region.

According to another embodiment of the present invention, a method for manufacturing an organic light emitting diode display includes: forming a first thin film transistor including a source electrode and a drain electrode at a first region of a substrate; forming a second thin film transistor including a source electrode and a drain electrode at a second region of the substrate; forming a protective layer on the first and second thin film transistors; forming a first via contact hole that exposes the source electrode or the drain electrode of the first thin film transistor by etching a portion of the protective layer; forming a first pixel electrode material layer on at least a portion of the surface of the substrate that includes the first via contact hole; etching the first pixel electrode material layer to form a first pixel electrode at the first region; forming a planarization layer on at least a portion of the surface of the substrate including the first pixel electrode; forming a second via contact hole that exposes the source electrode or the drain electrode of the second thin film transistor by etching portions of the protective layer and the planarization layer at the second region; forming a second pixel electrode material layer on at least a portion of the surface of the substrate including the second via contact hole; and etching the second pixel electrode material layer to form a second pixel electrode at the second region.

The forming of the second pixel electrode material layer may include: forming the reflective film material layer and a transparent electrode material layer on at least a portion of the surface of the substrate that includes the second via contact hole; forming a photoresist film on the portion of the surface of the substrate that includes the reflective film material layer and the transparent electrode material layer; forming a photoresist pattern by patterning the photoresist film; and forming the second pixel electrode on the second region by etching the reflective film material layer and the transparent electrode material layer by using the photoresist pattern as a mask.

The method may further include: after etching the second pixel electrode material layer, etching the planarization layer to form a planarization layer pattern that corresponds to a shape of the second pixel electrode by using the second pixel electrode as a mask.

The etching the planarization layer may expose an upper surface of the first pixel electrode at the first region.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
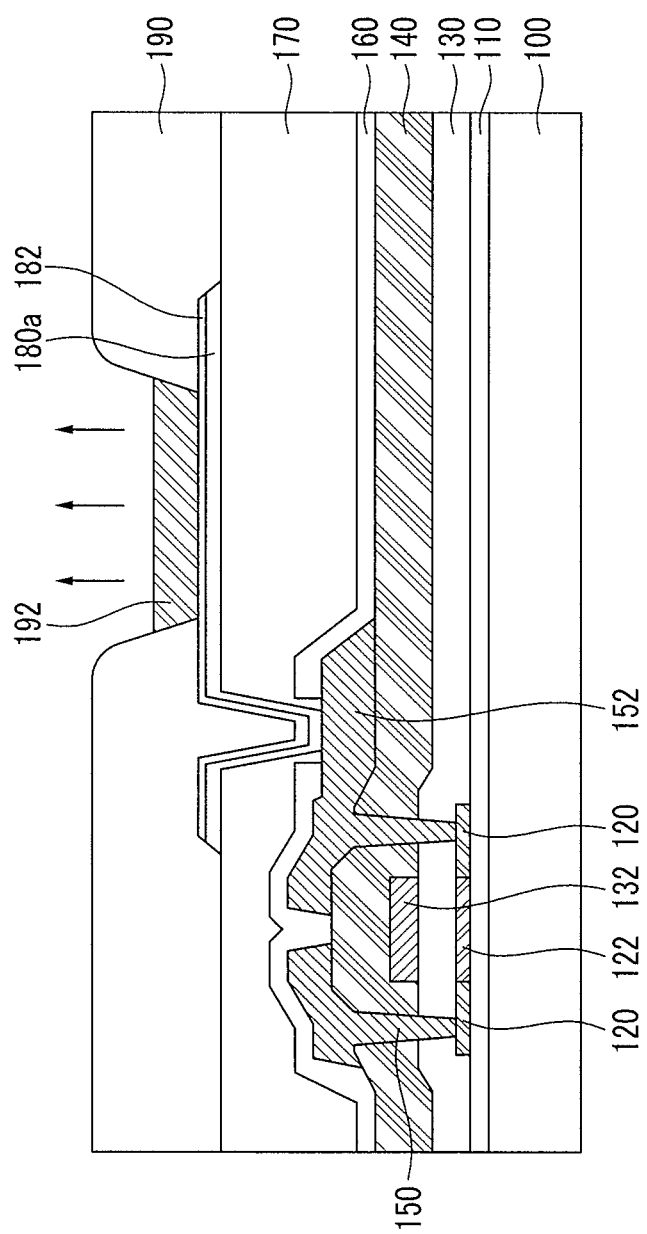
FIG. 1 is a cross-sectional view of an organic light emitting diode that is formed by a conventional process.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a cross-sectional view that illustrates an organic light emitting diode that is formed by a conventional process.

First, a buffer film 110 (e.g., having a predetermined thickness) is formed on a transparent insulation substrate 100, and a thin film transistor that is provided with a polysilicon pattern 122, a gate electrode 132, and source/drain electrodes 150 and 152 is formed on the buffer film 110. In this case, the source/drain region 120 in which the impurity is ion injected is provided on both sides of the polysilicon pattern 122, and a gate insulating layer 130 is formed on the entire surface of the buffer film 110 on which the polysilicon pattern 122 is formed, between the polysilicon pattern 122 and the gate electrode 132. An interlayer insulating layer 140 is formed on the entire surface of the gate insulating layer 130, including the gate electrode 132.

Next, a protective layer 160 (e.g., having a predetermined thickness) is formed on the entire surface of the interlayer insulating layer 140 and the source/drain electrodes 150 and 152, and the first via contact hole that exposes either one of the source/drain electrode 150 and 152 (e.g., the drain electrode 152) is formed by etching the protective layer 160 by a photolithography process. The protective layer 160 may include silicon nitride, silicon oxide or a layered structure thereof as an inorganic insulation film.

Next, a first insulation film 170 is formed on the entire surface. The first insulation film 170 may be formed of polyimide, benzocyclobutene series resin, spin on glass (SOG), or acrylate, and is formed for planarization of the pixel area.

Thereafter, a second via contact hole that exposes the first via contact hole is formed by etching the first insulation film 170 by using a photolithography process.

Next, a layered structure of a reflective film and a thin film for pixel electrode is formed on the entire surface. In this case, the reflective film is formed by using either one of metals that have a high reflectivity, such as aluminum (Al), molybdenum (Mo), titanium (Ti), gold (Au), silver (Ag), palladium (Pd), or an alloy thereof. When the reflective film is formed as described above, a top emission type organic light emitting diode is formed, and in the case of when the reflective film is formed later on during the manufacturing process, the bottom emission type organic light emitting diode is formed.

In addition, a thin film for the pixel electrode is formed in a thickness of 10 to 300 Å by using a transparent metallic material such as ITO (indium tin oxide).

Thereafter, the pixel electrode 182 and the reflective film pattern 180a are formed by etching the layered structure by using a photolithography process.

A second insulation film pattern 190 that defines the light emitting region is formed on the entire surface. The second insulation film pattern 190 may be formed of polyimide, benzocyclobutene series resin, phenol resin, acrylate, or combinations thereof.

Thereafter, an emission layer 192 is formed in a pixel area that is defined by the second insulation film pattern 190 by using a low molecular deposition method or laser heat transfer method. After that, an organic light emitting diode is formed by forming, for example, a counter electrode and the like. In one embodiment, when the OLED is a top emission type organic light emitting diode, the counter electrode is formed of a transparent electrode or a transparent metal electrode, and when the OLED is a bottom emission type organic light emitting diode, the counter electrode is formed of a metal electrode or a reflective electrode that is provided with a reflective film.

As described above, because the top emission type organic light emitting diode uses a resonance effect of light, the color coordinate is more controllable when the pixel electrode is thin. However, in a dual type organic light emitting diode that includes both a top emission type organic light emitting diode and a bottom emission type organic light emitting diode, if the pixel electrode that is used for the top emission type organic light emitting diode is also used in the bottom emission type organic light emitting diode, then there is a problem in that light property may be deteriorated in accordance with an increase of resistance.

FIGS. 2A, 2B, 2C, 2D, 2E, and 2F are cross-sectional views that illustrate a manufacturing method of a dual type organic light emitting diode display according to a first exemplary embodiment of the present invention.

Figure 2A:
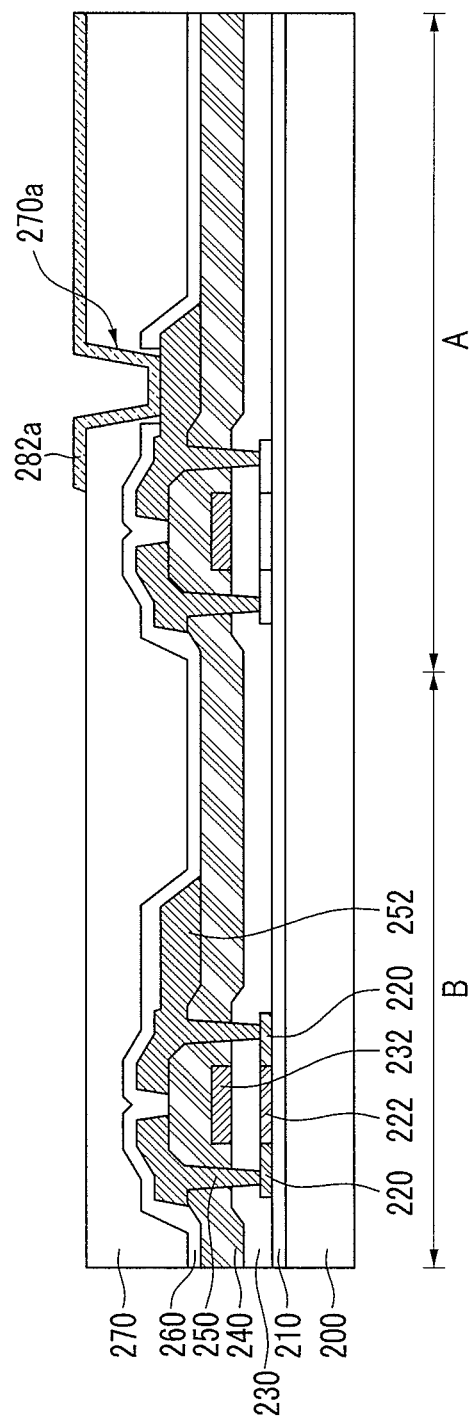
FIGS. 2A, 2B, 2C, 2D, 2E, and 2F are cross-sectional views that illustrate a method of manufacturing a dual type organic light emitting diode display according to a first exemplary embodiment of the present invention.

First, referring to FIG. 2A, the first region A and the second region B are defined on the transparent insulation substrate 100 such as glass, quartz, sapphire, and the like. As will be described later, the first region A is the bottom or dual emission type organic light emitting diode display region, and the second region B corresponds to the top emission type organic light emitting diode display region.

Next, a buffer film 210 (e.g., having a predetermined thickness) is formed on the front side of the transparent insulation substrate 200 by using silicon oxide by a plasma-enhanced chemical vapor deposition (PECVD) method. In this case, the buffer film 210 slows or prevents the diffusion of the impurity into the transparent insulation substrate 100 during the crystallization process of the amorphous silicon layer that is formed in the next process.

Next, an amorphous silicon layer (e.g., having a predetermined thickness) is deposited onto the buffer film 210, and the polysilicon pattern 222 is formed in a thin film transistor region in a unit pixel by crystallizing the amorphous silicon layer by using an excimer laser annealing (ELA), sequential lateral solidification (SLS), metal induced crystallization (MIC) or metal induced lateral crystallization (MILC) process and patterning it using a photolithography process. The region of the polysilicon pattern 222 includes source/drain regions 220 that are formed by the next process.

Next, a gate insulating layer 230 (e.g., having a predetermined thickness) is formed on the entire surface of the buffer layer 210 including the polysilicon pattern 222. The gate insulating layer 230 may be formed of silicon oxide, silicon nitride or a layered structure thereof.

A metal film that is used as the gate electrode material is formed on the gate insulating layer 230. In this case, the metal film may be formed of a single layer of aluminum (Al) or an aluminum alloy such as aluminum-neodymium (Al—Nd), or a multilayer in which the aluminum or aluminum alloy is layered on a chromium (Cr) or molybdenum (Mo) alloy. Next, the gate electrode 232 is formed by etching the metal film by a photolithography process. After that, the source/drain regions 220 are formed by ion-injecting an impurity into both sides of the polysilicon pattern 222 with respect to the gate electrode 232. Here, the gate electrode 232 is directly above the channel region of the polysilicon pattern 222.

After that, the interlayer insulating layer 240 that has (e.g., having a predetermined thickness) is formed on the entire surface of the gate insulating layer 230. In general, a silicon nitride film or a silicon oxide film is used as the interlayer insulating layer 240.

Thereafter, a contact hole is formed by etching the interlayer insulating layer 240 and the gate insulating layer 230 by a photolithography process to expose the source/drain regions 220. The electrode material is formed on the entire surface that includes the contact hole, and the source/drain electrodes 250 and 252 that are respectively connected to the source/drain regions 220 are formed by etching the electrode material by a photolithography process. In some embodiments, molytungsten (MoW) or aluminum-neodymium (Al—Nd) may be used as the electrode material, and, in other embodiments, a layered structure thereof may be used.

Thereafter, the protective layer 260 is formed by depositing a silicon nitride film, a silicon oxide film, or a layered structure thereof on the surface (e.g., at a predetermined thickness), and the first planarization layer 270 is formed on the protective layer 260. The first planarization layer 270 is formed to have a sufficient thickness so that the thin film transistor region is planarized, and may be formed of one or more of polyimide, benzocyclobutene series resin, spin on glass (SOG), or acrylate, and is formed for planarization of the pixel area.

Next, the first via contact hole 270a that exposes either one of the source/drain electrodes 250 and 252 of the first region A (e.g., the drain electrode 252), is formed by etching the protective layer 260 and the first planarization layer 270 of the first region A by a photolithography process.

Next, the material layer for the transparent electrode (or transparent electrode material layer) is formed on the entire surface. The material layer for the transparent electrode may be formed by using a transparent metal electrode (or a transparent conductive material) such as ITO (indium tin oxide), IZO (indium zinc oxide), $In_2O_3$, or $Sn_2O_3$.

The first pixel electrode 282a is electrically connected to either one of the source/drain electrodes 250 and 252 (e.g., the drain electrode 252) is formed at the first region A by wet etching or dry etching the material layer for the transparent electrode.

Figure 2B:
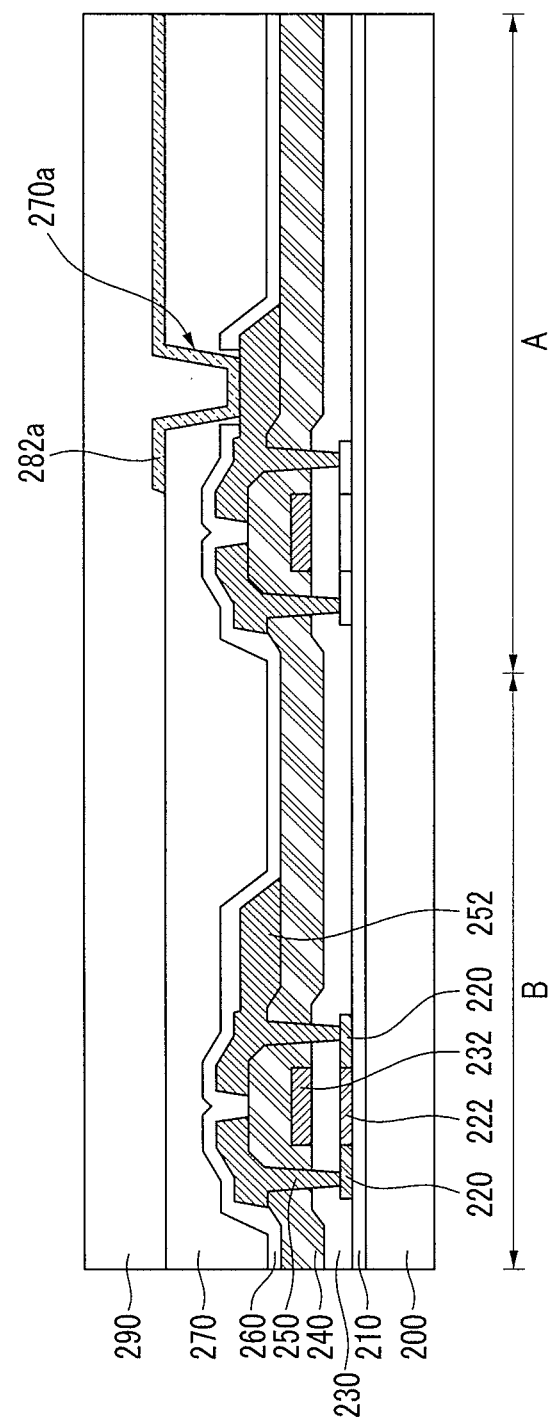

Next, referring to FIG. 2B, a second planarization layer 290 is formed on the entire surface of the substrate that includes the first pixel electrode 282a at the first region A. The second planarization layer 290 is formed in a sufficient thickness so that the entire surface of the substrate including the first pixel electrode 282a is planarized, and may be formed of one or more of polyimide, benzocyclobutene series resin, spin on glass (SOG), or acrylate.

Figure 2C:
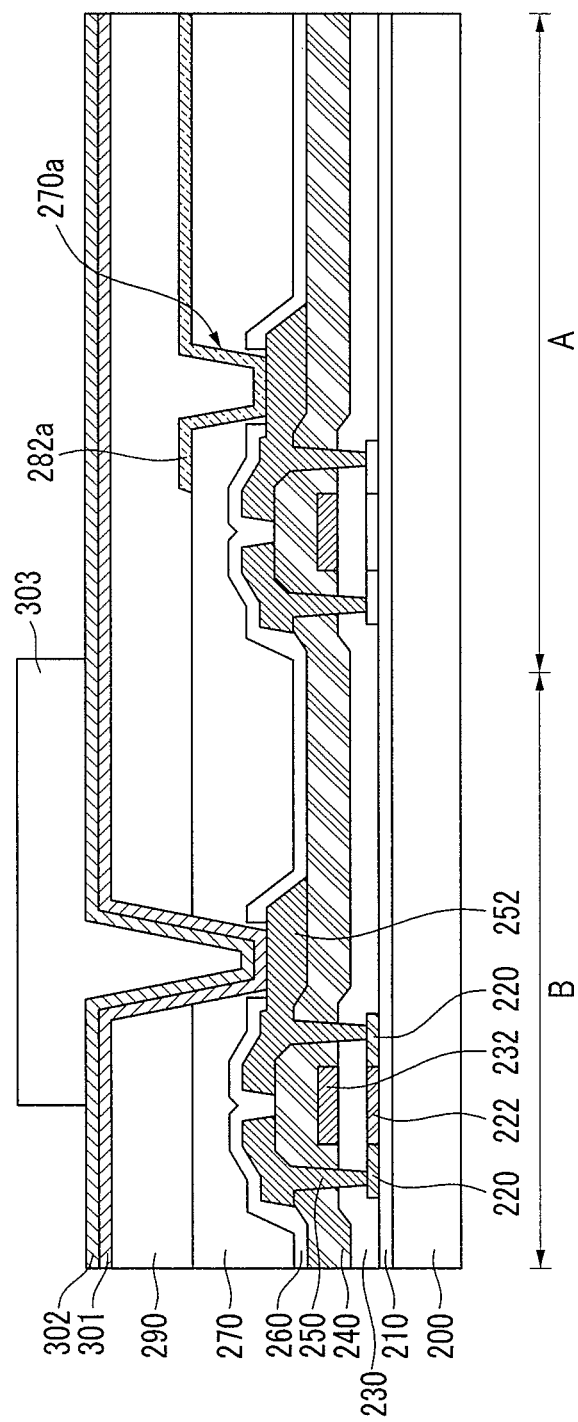

Next, referring to FIG. 2C, a second via contact hole that exposes either one of the source/drain electrodes 250 and 252 of the second region B (e.g., the drain electrode 252) is formed by etching the protective layer 260, the first planarization layer 270 and the second planarization layer 290 of the second region B by a photolithography process.

Next, a reflective film material layer 301 and the material layer for the transparent electrode 302 (or transparent electrode material layer) are formed on the entire surface of the second planarization layer 290. The reflective film material layer 301 may be formed of silver (Ag), palladium (Pd), or platinum (Pt) and may have a reflectivity of 80%. In one embodiment, the reflective film material layer 301 is formed of silver (Ag). The reflective film may be 500 to 3000 Å thick. In addition, the material layer for the transparent electrode 302 may be formed of a transparent metal electrode (or transparent conductive material) such as ITO (indium tin oxide), IZO (indium zinc oxide), $In_2O_3$ or $Sn_2O_3$. In one embodiment, the material layer for the transparent electrode 302 has a thickness of 10 to 300 Å, and in another embodiment, has a thickness of 20 to 100 Å, thereby improving the controllability of the color coordinate.

Next, a photoresist pattern 303 is formed by forming a photoresist film on the entire surface of the substrate including the reflective film material layer 301 and the material layer for the transparent electrode 302 and patterning the photoresist film. In one embodiment of the present invention, the photoresist pattern 303 is formed so that it corresponds to the shape of the second pixel electrode that will be formed in the second region B.

Figure 2D:
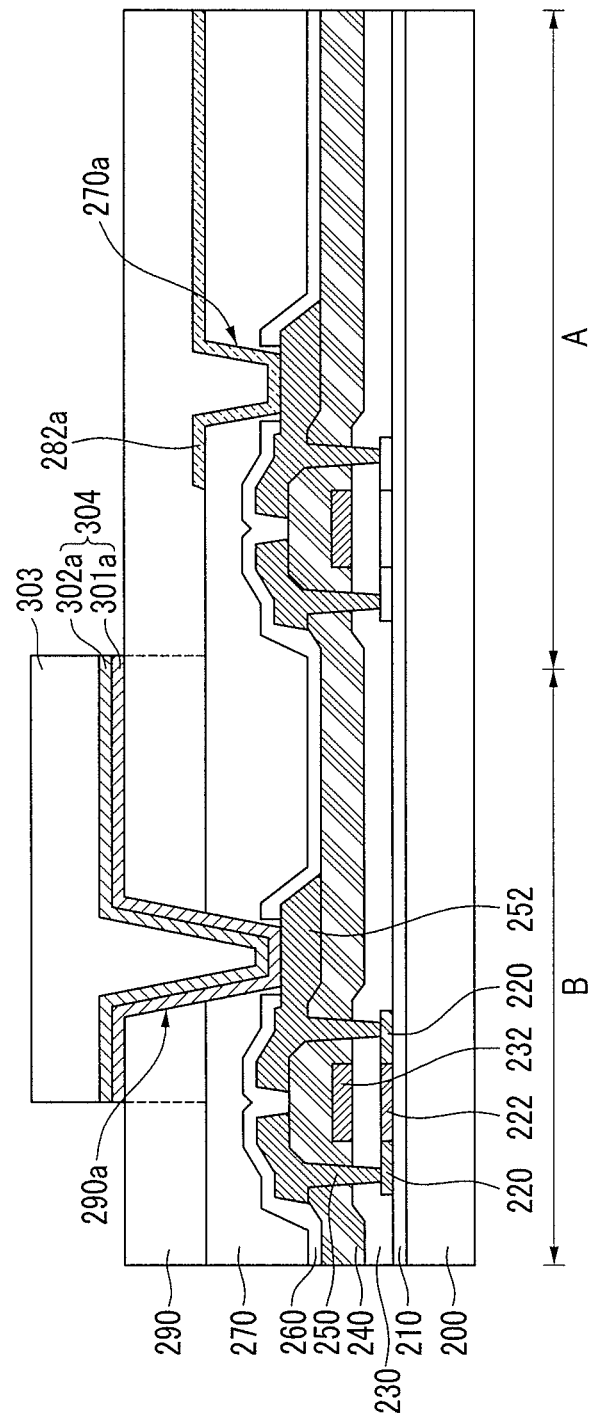

After that, referring to FIG. 2D, the second pixel electrode 304 that is electrically connected to either one of the source/drain electrodes 250 and 252 (e.g., the drain electrode 252) is formed at the second region B by wet etching or dry etching the reflective film material layer 301 and the material layer for the transparent electrode 302 by using the photoresist pattern 303 as a mask.

In one embodiment, the second pixel electrode 304 includes the reflective film pattern 301a and the transparent electrode pattern 302a, where the reflective film pattern 301a reflects light in the second region B to increase luminance and light efficiency, and the top emission type organic light emitting diode display is realized by the reflective film pattern 301a in the second region B.

Figure 2E:
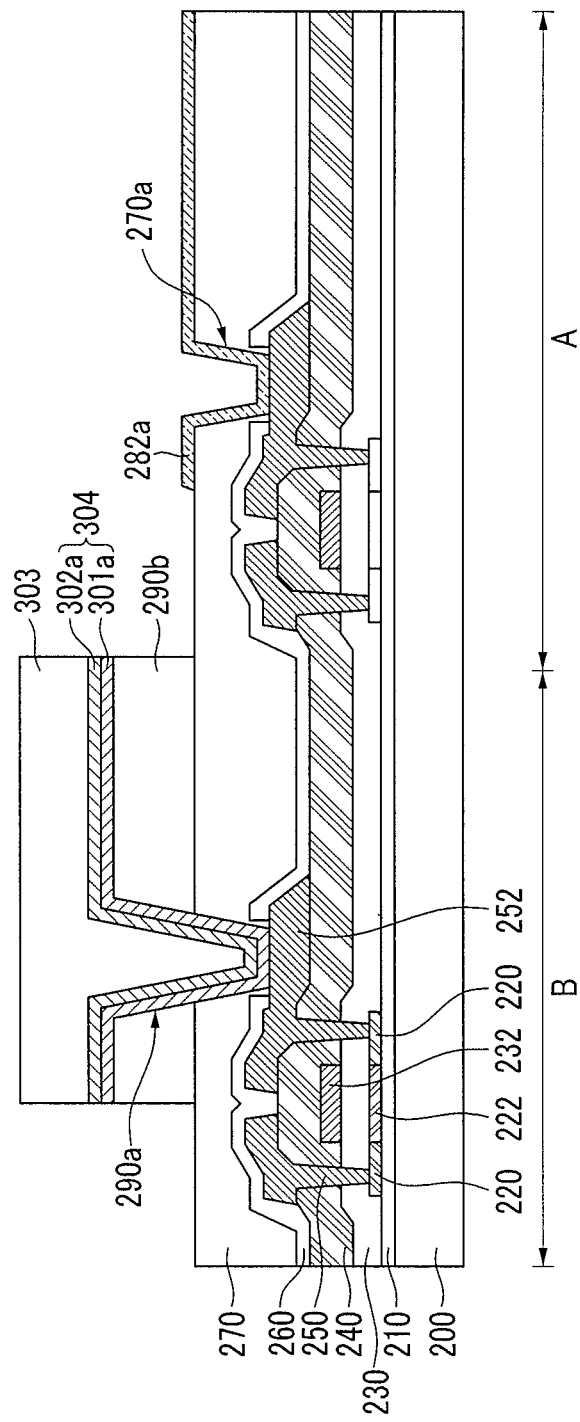

Next, referring to FIG. 2E, a second planarization layer pattern 290a that corresponds to the shape of the second pixel electrode 304 is formed by etching the second planarization layer 290 by using the second pixel electrode 304, that is, the reflective film pattern 301a and the transparent electrode pattern 302a as the mask.

In one embodiment, the second planarization layer 290 may be etched until the upper surface of the first pixel electrode 282a of the first region A is exposed.

Figure 2F:
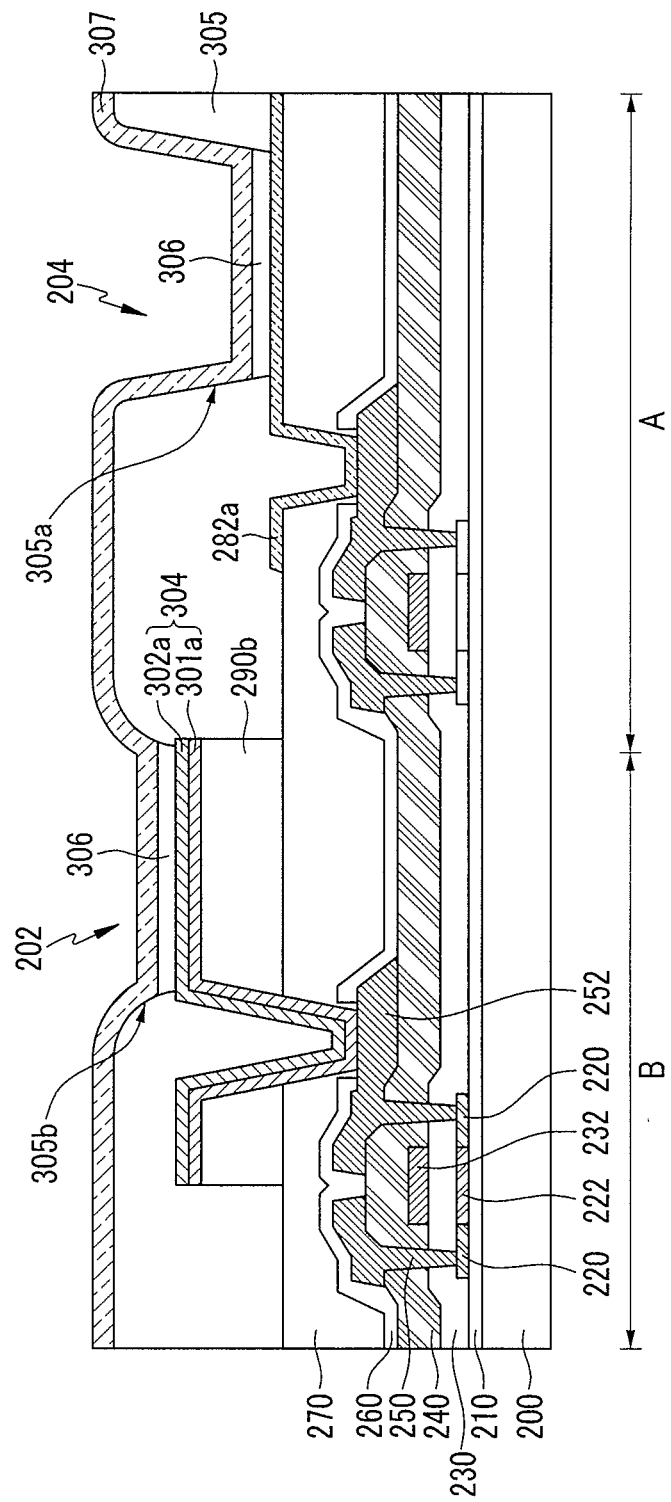

Next, referring to FIG. 2F, the photoresist pattern 303 that is formed on the second pixel electrode 304 is removed, and a pixel defining film material is formed on the entire surface of the substrate.

Next, the pixel defining film 305 that includes openings that define the light emitting regions in the first region A and the second region B is formed by etching the pixel defining film material by photolithography.

In this case, the opening includes a first opening 305a that exposes a portion of the first pixel electrode 282a of the first region A and a second opening 305b that exposes a portion of the second pixel electrode 304 of the second region B.

Next, an organic film layer 306 is formed on the pixel defining film layer that includes the openings. The organic film layer 306 is formed by a low molecular deposition method or laser heat transfer method. The organic film layer 306 may be formed of at least one of thin film such as an electron injection layer (EIL), an electron transport layer (ETL), a hole injection layer, a hole transport layer, a hole block layer, or an organic emission layer.

As the hole transport material that forms the hole transport layer. N,N'-di(naphthalene-1-yl)-N,N'-diphenyl-benzidine: a-NPB, N,N'-bis(3-methylphenyl)-N,N'-diphenyl-[1,1'-biphenyl]-4,4'-diamine (TPD) or the like may be used. In addition, the film thickness of the hole transport layer may be in the range of 10 to 50 nm. It is not preferable to deviate from the thickness range of the hole transport layer, because a hole injection characteristic may be deteriorated.

Regarding the hole transport layer, in one embodiment of the present invention, a dopant that can emit light in response to the electron-hole combination such as 4-(dicyanomethylene)-2-t-butyl-6-(1,1,7,7-tetramethyljulolidyl-9-enyl)-4H-pyran (DCJTB), Coumarin 6, rubrene, DCM, DCJTB, perylene, quinacridone, or the like may be used, and its content may be 0.1 to 5 wt % with respect to the total weight of the material forming the hole transport layer. As described above, when the hole transport layer is formed, if the dopant is added, the color of the emitted light can be controlled according to the kind and content of the dopant, and a life-span of the diode may be improved by improving the thermal stability of the hole transport layer.

In addition, the hole injection layer may be formed by using a starburst amine-based compound, and the thickness of the hole injection layer may be in the range of 30 to 100 nm. Outside of the thickness range of 30 to 100 nm, a hole injection characteristic of the hole injection layer is poor, which may degrade the performance of the hole injection layer. Through the hole injection layer, a contact resistance between the counter electrode and the hole transport layer is lowered, such that a hole transport ability of the anode electrode is improved, thus generally improving the characteristic of the diode.

The material for forming the emission layer of the embodiment is not limited, and may be made of other materials, such as CBP(4,4'-bis(carbazol-9-yl)-biphenyl).

In one embodiment of the present invention, the emission layer of the embodiment further includes a dopant that can emit light in response to the electron-hole combination, like the above hole transport layer. In one embodiment, the kind and content of the dopant are almost the same as those of the hole transport layer, and the film thickness of the emission layer may be in the range of 10 to 40 nm.

Tris(8-quinolinolate)-aluminum (Alq3) or tris(4-methyl-8-hydroxyquinoline)-aluminum (Almq3) may be used as the electron transport material for forming the electron transport layer (ETL), and like the above hole transport layer, the electron transport layer may further include a dopant that can emit light in response to the electron-hole combination. In this case, the kind and content of the dopant are almost the same as those of the hole transport layer, and the film thickness of the electron transport layer (ETL) may be in the range of 30 to 100 nm. When the thickness of the electron transport layer deviates from the thickness of 30 to 100 nm, efficiency may be deteriorated and the driving voltage may be increased.

A hole block layer (HBL) may be further formed between the emission layer and the electron transport layer (ETL). Here, the hole block layer impedes or prevents excitons that are formed in a phosphorescent light emitting material from moving to the electron transport layer (ETL) or impedes or prevents holes from moving to the electron transport layer (ETL), and BAlq may be used as the material for forming the hole block layer.

The electron injection layer (EIL) may include LiF, and the thickness thereof may be in the range of 0.1 to 10 nm. When the thickness of the electron injection layer is outside of the range of 0.1 to 10 nm, the driving voltage may be increased, which may degrade performance.

Next, the dual type organic light emitting diode display according to the first exemplary embodiment may be manufactured by forming a counter electrode 307 on the entire surface of the substrate that includes the organic film layer 306. In this case, the counter electrode is formed of the transparent electrode or reflective electrode in which a reflective film is layered in the first region A, and is formed of the transparent electrode or the transparent metal electrode in the second region B. In addition, the counter electrode of the first region A may be formed of the transparent electrode or the transparent metal electrode like the counter electrode of the second region B.

The dual type organic light emitting diode display according to the first exemplary embodiment implements the top emission type organic light emitting diode display in the second region B, and the bottom emission type or dual emission type organic light emitting diode display in the first region A.

In this case, it can be seen that, in the first embodiment, both the pixel electrode of the top emission type organic light emitting diode (i.e., the second pixel electrode) display and the pixel electrode of the bottom emission type or dual emission type organic light emitting diode (i.e., the first pixel electrode) display are formed.

The conventional dual type organic light emitting diode in which the pixel electrode that is used in the top emission organic light emitting diode is also used in the bottom emission type, in the case of pixel electrode of the bottom emission organic light emitting diode has a problem in that a light characteristic deteriorates according to an increase of resistance.

That is, because the top emission type organic light emitting diode display uses a resonance effect of light, performance can be improved by forming a thin transparent electrode (e.g., thinner transparent electrodes may provide better performance) on the reflective film, but in the dual panel type, because in general the top emission type and the bottom emission type organic light emitting diodes are concurrently formed, such that when the pixel electrode is made thin (e.g., as thin as practicable by the manufacturing process) for the top emission type organic light emitting diode display, the resistance of the pixel electrode is increased for the bottom emission organic light emitting diode because the film thickness of the pixel electrode is thin, thus deteriorating the light characteristic.

However, in embodiments of the present invention, because the pixel electrode (e.g., the second pixel electrode) of the top emission type organic light emitting diode and the pixel electrode (e.g., the first pixel electrode) of the bottom emission type or dual emission type organic light emitting diode are formed by different processes, the pixel electrode (e.g., the first pixel electrode) of the bottom emission type or dual emission type organic light emitting diode may be formed independently of the pixel electrode (e.g., the second pixel electrode) of the top emission type organic light emitting diode, such that the pixel electrode of the bottom emission organic light emitting diode has a sufficient thickness to avoid a problem with high resistance.

Meanwhile, in the case of the conventional dual type organic light emitting diode display, because each pixel electrode is formed by patterning the top emission type reflective film through the first mask and patterning a transparent electrode of the top emission type and the bottom emission type or dual emission type through the second mask, a two mask process is needed to form the pixel electrode.

In addition, in the first embodiment of the present invention, because the first pixel electrode 282a of the bottom emission type or dual emission type is formed through the first mask, and the second pixel electrode 304 of the top emission organic light emitting diode is formed through the second mask, a two mask process is needed in forming of the pixel electrode.

In result, in the first embodiment of the present invention, as compared to the known art, the pixel electrodes can be formed without an increase of the mask process (e.g., the number of steps in the mask process) for forming the pixel electrode, because each pixel electrode can be formed by separate processes, it is possible to arbitrarily (or independently) control the thicknesses of pixel electrode of the bottom emission type or dual emission type without increasing the complexity of the manufacturing process.

Figure 3A:
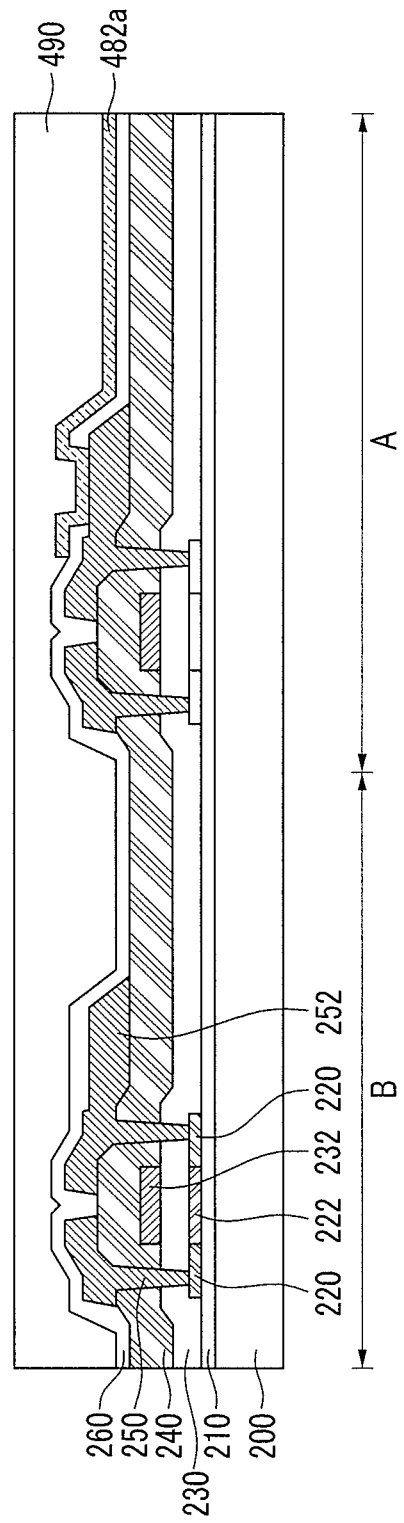
FIGS. 3A and 3B are cross-sectional views that illustrate a method of manufacturing a dual type organic light emitting diode display according to a second exemplary embodiment of the present invention.
Figure 3B:
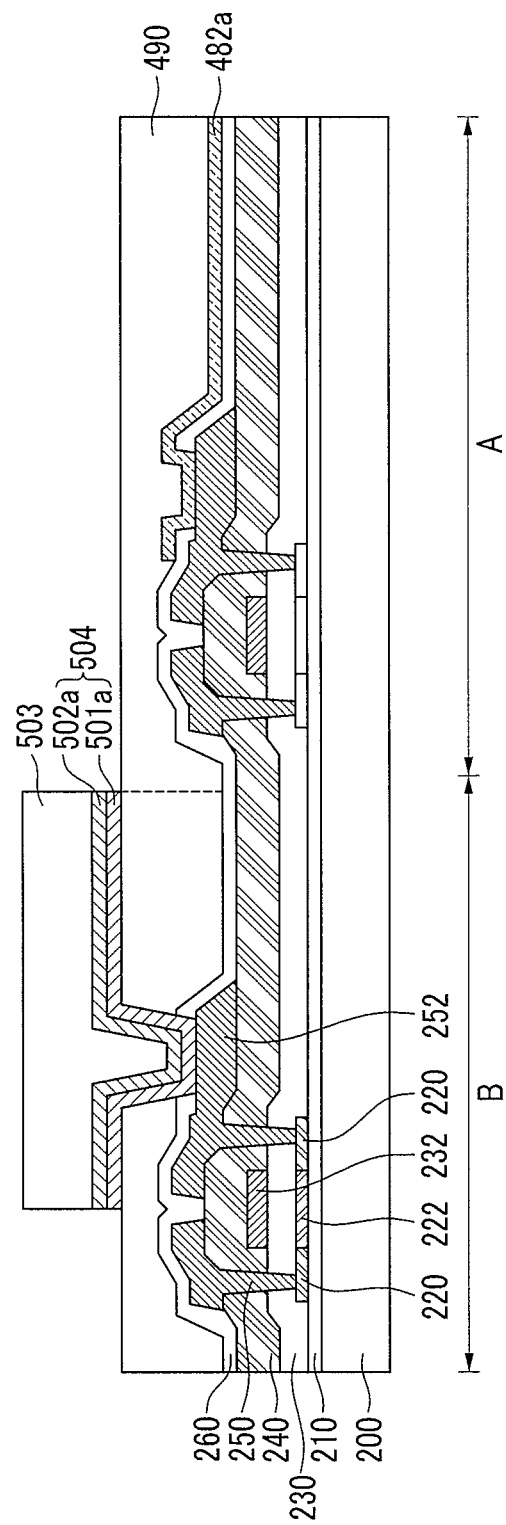

FIGS. 3A and 3B are cross-sectional views that illustrate a manufacturing method of a dual type organic light emitting diode display according to a second exemplary embodiment of the present invention.

The dual type organic light emitting diode display according to the second exemplary embodiment may be the same as the dual type organic light emitting diode display according to the first exemplary embodiment except for the following description.

First, referring to FIG. 3A, similar to the first exemplary embodiment, the source/drain electrodes 250 and 252 that are connected to the source/drain regions 220 are formed by etching the electrode material by a photolithography process, and the protective layer 260 is formed by depositing a silicon nitride film, a silicon oxide film, or a layered structure thereof (e.g., at a predetermined thickness) on the source/drain electrodes 250 and 252.

Next, the first via contact hole that exposes either one of the source/drain electrodes 250 and 252 of the first region (e.g., the drain electrode 252) is formed by etching the protective layer 260 by a photolithography process.

Next, the material layer for the transparent electrode (or transparent electrode material layer) is formed on the entire surface, and the first pixel electrode 482a that is electrically connected to either one of the source/drain electrodes 250 and 252 (e.g., the drain electrode 252) is formed at (e.g., directly formed on) the first region A by wet etching or dry etching the material layer for the transparent electrode.

Next, the planarization layer 490 is on (e.g., directly formed on) the entire surface of the substrate that includes the first pixel electrode 482a formed on the first region A. The planarization layer 490 is formed in a sufficient thickness so that the entire surface of the substrate that includes the first pixel electrode 482a is planarized, and may be formed of one or more of polyimide, benzocyclobutene series resin, spin on glass (SOG), acrylate, and combinations thereof.

That is, in the first exemplary embodiment, the planarization layer is formed on the protective layer, and the first pixel electrode is formed on the planarization layer, but in the second exemplary embodiment, a process for forming the planarization layer may be omitted.

As described above, in the first exemplary embodiment, in order to planarize the thin film transistor region, the first planarization layer is formed on the protective layer.

The planarization of the thin film transistor region improves the performance of the top emission type organic light emitting diode display. That is, the top emission type organic light emitting diode display includes the reflective film pattern for light reflection, and a planarized lower film increases the light efficiency and luminance of light emitted, because the reflective film pattern without a step (e.g., so that the reflective film pattern is relatively flat).

However, in the second exemplary embodiment of the present invention, because the reflective film pattern for light reflection of the top emission type organic light emitting diode display is formed on the planarization layer that is formed on the pixel electrode of the bottom emission type or dual emission type organic light emitting diode display, even though the process for forming the planarization layer on the protective layer is omitted, the lower portion of the reflective film pattern may be planarized.

In addition, regarding the bottom emission type or dual emission type organic light emitting diode display, because light is provided to the substrate in order to perform the bottom emission, film under the pixel electrode may reduce the brightness of the OLED, because the organic film that is the material of the planarization layer has low light permeability. Therefore, in some embodiments of the present invention, the pixel electrode of the bottom emission type or dual emission type organic light emitting diode display is directly formed on the protective layer.

Next, referring to FIG. 3B, the second via contact hole that exposes either one of the source/drain electrodes 250 and 252 of the second region B (e.g., the drain electrode 252) is formed by etching the protective layer 260 and the planarization layer 490 of the second region B by a photolithography process.

Thereafter, a reflective film material layer and a material layer for the transparent electrode are formed on the entire surface, the photoresist film is formed on the entire surface of the substrate that includes the reflective film material layer and the material layer for the transparent electrode, and the photoresist pattern 503 is formed by patterning the photoresist film. In this case, the photoresist pattern 503 is formed so that it corresponds to the shape of the second pixel electrode that will be formed in the second region B.

After that, the second pixel electrode 504 that is electrically connected to either one of the source/drain electrodes 250 and 252 (e.g., the drain electrode 252) on the second region B is formed by wet etching or dry etching the reflective film material layer and the material layer for the transparent electrode by using the photoresist pattern 503 as the mask.

In this embodiment, the second pixel electrode 504 includes the reflective film pattern 501a and the transparent electrode pattern 502a, the reflective film pattern 501a reflects light in the second region B to increase luminance and light efficiency, and the top emission type organic light emitting diode display is implemented by the reflective film pattern 501a in the second region B.

In the embodiment described above, the reflective film pattern 501a is formed on the planarization layer 490 that planarizes the entire surface of the substrate that includes the first pixel electrode 482a, even though a separate planarization layer is not formed on the protective layer 260, and the lower portion of the reflective film pattern may be planarized.

Because the remaining process or steps are substantively similar to the corresponding processes or steps of the first exemplary embodiment, they are not described herein. Using the processes described herein, the dual type organic light emitting diode display according to the second exemplary embodiment can be manufactured.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode display comprising
a substrate having a first region and a second region;
a first thin film transistor comprising a source electrode and a drain electrode at the first region;
a second thin film transistor comprising a source electrode and a drain electrode at the second region;
a protective layer on the first and second thin film transistors;
a first planarization layer on the protective layer;
a second planarization layer pattern on the first planarization layer;
a first pixel electrode electrically connected to the source electrode or the drain electrode of the first thin film transistor through a first via contact hole formed through the protective layer and the first planarization layer; and
a second pixel electrode electrically connected to the source electrode or the drain electrode of the second thin film transistor through a second via contact hole formed through the protective layer, the first planarization layer, and the second planarization layer pattern, the second planarization layer corresponding to a shape of the second pixel electrode and being located between the first planarization layer and the second pixel electrode.

2. The organic light emitting diode display of claim 1, wherein:
the protective layer comprises a silicon nitride film, a silicon oxide film, or a layered structure thereof.

3. The organic light emitting diode display of claim 1, wherein the first planarization layer and the second planarization layer pattern comprise a material that is selected from the group consisting of polyimide, benzocyclobutene series resin, spin on glass (SOG), and acrylate, and combinations thereof.

4. The organic light emitting diode display of claim 1, wherein the second pixel electrode comprises a reflective film pattern and a transparent electrode pattern.

5. The organic light emitting diode display of claim 4, wherein the transparent electrode pattern has a thickness in the range of 10 to 300 Å.

6. The organic light emitting diode display of claim 1, wherein the first pixel electrode comprises a transparent electrode pattern.

7. The organic light emitting diode display of claim 1, wherein the first region comprises a bottom emission or dual emission organic light emitting diode, and the second region comprises a top emission organic light emitting diode.

8. The organic light emitting diode display of claim 1, wherein the second planarization layer pattern and the first pixel electrode are formed on the first planarization layer.

9. An organic light emitting diode display comprising:
a substrate having a first region and a second region;
a first thin film transistor comprising a source electrode and a drain electrode at the first region of the substrate;
a second thin film transistor comprising a source electrode and a drain electrode at the second region of the substrate;
a protective layer on the first and second thin film transistors;
a planarization layer pattern on the protective layer;
a first pixel electrode electrically connected to the source electrode or the drain electrode of the first thin film transistor through a first via contact hole formed through the protective layer; and
a second pixel electrode electrically connected to the source electrode or the drain electrode of the second thin film transistor through a second via contact hole formed through the protective layer and the planarization layer pattern, the planarization layer pattern corresponding to a shape of the second pixel electrode and being located between the protective layer and the second pixel electrode.

10. The organic light emitting diode display of claim 9, wherein the protective layer comprises a silicon nitride film, a silicon oxide film, or a layered structure thereof.

11. The organic light emitting diode display of claim 9, wherein the planarization layer pattern comprises a material selected from the group consisting of polyimide, benzocyclobutene series resin, spin on glass (SOG), acrylate, and combinations thereof.

12. The organic light emitting diode display of claim 9, wherein the first region comprises a bottom emission or dual emission organic light emitting diode, and the second region comprises a top emission organic light emitting diode.

13. The organic light emitting diode display of claim 9, wherein the second pixel electrode comprises a reflective film pattern and a transparent electrode pattern.

14. The organic light emitting diode display of claim 13, wherein the transparent electrode pattern has a thickness in the range of 10 to 300 Å.

15. The organic light emitting diode display of claim 9, wherein the first pixel electrode comprises a transparent electrode pattern.

16. The organic light emitting diode display of claim 9, wherein the planarization layer pattern and the first pixel electrode are formed on the protective layer.

* * * * *